(12) United States Patent
Cuijpers (10) Patent No.: US 7,456,527 B2
(45) Date of Patent: Nov. 25, 2008

(54) MOVEABLE OBJECT CARRIER, LITHOGRAPHIC APPARATUS COMPRISING THE MOVEABLE OBJECT CARRIER AND DEVICE MANUFACTURING METHOD

(75) Inventor: Martinus Agnes Willem Cuijpers, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 95 days.

(21) Appl. No.: 10/792,271

(22) Filed: Mar. 4, 2004

(65) Prior Publication Data
US 2005/0195381 A1 Sep. 8, 2005

(51) Int. Cl.
*H02K 41/00* (2006.01)
(52) U.S. Cl. .......................... 310/12; 310/53
(58) Field of Classification Search .................. 310/12; 355/53, 72, 53.72
See application file for complete search history.

(56) References Cited

U.S. PATENT DOCUMENTS

| | | | | |
|---|---|---|---|---|
| 4,839,543 A | * | 6/1989 | Beakley et al. ................. 310/12 |
| 4,985,651 A | * | 1/1991 | Chitayat ....................... 310/12 |
| 5,519,266 A | * | 5/1996 | Chitayat ....................... 310/12 |
| 5,623,853 A | * | 4/1997 | Novak et al. ............... 74/490.09 |
| 6,144,119 A | * | 11/2000 | Hazelton ....................... 310/12 |
| 6,635,887 B2 | * | 10/2003 | Kwan et al. ................ 250/491.1 |
| 6,661,125 B2 | * | 12/2003 | Itoh et al. ...................... 310/12 |
| 6,727,666 B2 | * | 4/2004 | Kyomasu et al. ............... 318/34 |
| 6,750,625 B2 | * | 6/2004 | Binnard et al. ............... 318/592 |
| 2002/0018195 A1 | * | 2/2002 | Iwamoto et al. ............... 355/72 |

* cited by examiner

*Primary Examiner*—Nguyen N Hanh
(74) *Attorney, Agent, or Firm*—Pillsbury Winthrop Shaw Pittman, LLP (57) ABSTRACT

A moveable object carrier is moveable in a first direction and in a second direction to be positioned in a plane. The object carrier may be moved in the first direction by a first and a second linear actuator. The first and second linear actuators are adapted to support the object carrier. Thereto the linear actuators may comprise additional bearing and the linear actuators are positioned relative to the object carrier such that no other bearing is required to prevent the object carrier from falling or tilting.

The object carrier may be moved in the second direction by a third and a fourth linear actuator, which linear actuators may be adapted to support the first and the second linear actuators.

25 Claims, 4 Drawing Sheets

MOVEABLE OBJECT CARRIER, LITHOGRAPHIC APPARATUS COMPRISING THE MOVEABLE OBJECT CARRIER AND DEVICE MANUFACTURING METHOD

BACKGROUND OF THE INVENTION

1. Field of the Invention

The present invention relates to a moveable object carrier, lithographic apparatus and a device manufacturing method, and more in particular to a system configured to carry and move an object in a plane.

2. Description of the Related Art

Lithographic apparatus can be used, for example, in the manufacture of integrated circuits (ICs). In such a case, a patterning device may be used to generate a desired circuit pattern corresponding to an individual layer of the IC, and this pattern can be imaged onto a target portion (e.g. comprising one or more dies) on a substrate (silicon wafer) that has been coated with a layer of radiation-sensitive material (resist).

In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

A number of components such as the patterning device and the substrate need to be positioned at specific locations in a lithographic apparatus before processing, (e.g. a substrate on a substrate carrier to a position in an illumination path). Thereto, the lithographic apparatus comprises a number of actuators connected to carriers. In a prior art lithographic apparatus, the substrate carrier is connected to a linear actuator to move the object carrier in a first direction, which linear actuator is horizontally spaced apart from a center of gravity of the object carrier.

Since conventional linear actuators are horizontally spaced apart from the center of gravity of the object carrier, the line of action of the gravity on the object carrier lies beside the linear actuator. Thus, a moment of force is exerted on the object carrier and therefore, the linear actuator cannot fully support the object carrier such that the object carrier does not fall. Additional bearing is needed to support the object carrier. In the prior art lithographic apparatus, an air foot, i.e. an air bearing, and a stone are included to support the object carrier, requiring additional costs. Despite the additional bearing, there are high bearing loads, for example due to horizontally tilting of the object carrier, present on the linear actuator limiting the maximum acceleration of the object carrier. Further, expensive linear actuators arranged for such high bearing loads are required.

SUMMARY OF THE INVENTION

The principles of the present invention, as embodied and broadly described herein, provide an improved moveable object carrier without additional bearings. In one embodiment, a system configured to carry and move an object in a plane, comprises an object carrier, a first and a second linear actuator configured to move the object carrier in a first direction, the first and second linear actuators extending in parallel in said first direction, and a third and a fourth linear actuator configured to move the object carrier in a second direction the third and fourth linear actuators extending in parallel in the second direction. The said first and second linear actuators are adapted to support the object carrier.

In a system according to the present invention, a first and a second linear actuator are positioned in parallel. Thus, both linear actuators may move the object carrier in the first direction. Further, the first and second linear actuators are adapted to support the object carrier. To support the object carrier the linear actuators need to be able to bear the object carrier and not only move the object carrier. With the linear actuators supporting the object carrier, no additional bearing of the object carrier is needed.

According to the present invention, the linear actuators may be any kind of actuators configured to move an object such as an object carrier in one straight direction and to support such an object. The linear actuator may be constructed from an electrical actuator possibly using a gear and gear rack, a geared-belt drive, a (electron) magnetic system, or any other kind of actuator. The actuator may employ air bearing to support the object carrier, or any other kind of bearing. In case of a gear and gear rack, the object carrier may also be supported by, for example, the gear positioned on the gear rack without need for any dedicated bearing.

The object carrier may be a table structure on which an object is positioned. However, it may also be any other kind of carrier. Another possible embodiment of the carrier is for example an electromagnetic carrier carrying an object under the carrier using magnetic coupling forces.

The first and second linear actuators may be positioned on horizontally opposite sides of a center of gravity of the object carrier, i.e. a vertical line through a center of gravity of the object carrier is positioned between the first and second linear actuators. Thus, the line of action of the gravity lies between the two linear actuators. Such a construction allows the first and second linear actuators to support the object carrier, since any generated moment of force is compensated.

Using two linear actuators positioned on horizontally opposite sides of the center of gravity of the object carrier has an additional advantage. In a system having one linear actuator horizontally spaced apart from the center of gravity of the object carrier, when the linear actuator accelerates, a moment of force is generated in the horizontal plane due to inertia of the object carrier. Due to this moment of force, the object carrier may slightly rotate in the horizontal plane. When using two linear actuators according to the present invention, the linear actuators may compensate any resulting moment on the object carrier preventing any rotation of the object carrier.

Advantageously, both linear actuators are positioned on horizontally opposite ends of the object carrier, which results in a more stable construction.

Preferably, the linear actuators are substantially symmetrically positioned with respect to the object carrier, in particular with respect to the center of gravity of the object carrier, in which case no moment on the object carrier results if both linear actuators exert the same force on the object carrier. Further, the system may be provided with a control system to ensure that the linear actuators accelerate with the same amount and move with the same speed to prevent any rotation of the object carrier.

The system according to the present invention may move the object carrier in a second direction. The system comprises thereto a third and a fourth linear actuator configured to move the object carrier in said second direction, said third and fourth linear actuators extending in parallel in said second direction. Further, the object carrier and the first and second linear actuators may be supported by the third and the fourth linear actuators. The system may similarly be further extended to any other direction.

Advantageously, the second direction is perpendicular to the first direction, since two perpendicular directions form a Cartesian coordinate system, enabling to position the object carrier on any location in a plane using two unambiguous coordinates and using a simple control method known to a person skilled in the art.

According to another embodiment, there is provided a lithographic apparatus comprising an object carrier; and a first and a second linear actuator configured to move said object carrier in a first direction, said first and second linear actuators extending in parallel in said first direction; and a third and a fourth linear actuator configured to move the object carrier in a second direction, said third and fourth linear actuators extending in parallel in said second direction; wherein said first and second linear actuators are adapted to support said object carrier.

According to another embodiment, there is provided a method for carrying and moving an object in a plane, the method comprising positioning the object on an object carrier, the object carrier being supported by a first and a second linear actuator, the actuators being positioned on horizontally opposite sides of a center of gravity of the object carrier and being positioned in parallel, and controlling the first and second linear actuators to move the object carrier in a first direction.

According to another embodiment, there is provided a device manufacturing method comprising positioning the object on an object carrier, the object carrier being moveable by a first and a second linear actuator in a first direction and by a third and a fourth linear actuator in a second direction, the first and second linear actuators being adapted to support the object carrier, and controlling the first and second linear actuators to move the object carrier in the first direction and/or controlling the third and fourth linear actuators to move the object carrier in the second direction.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc.

The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to means that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Lithographic Apparatus

Figure 1:
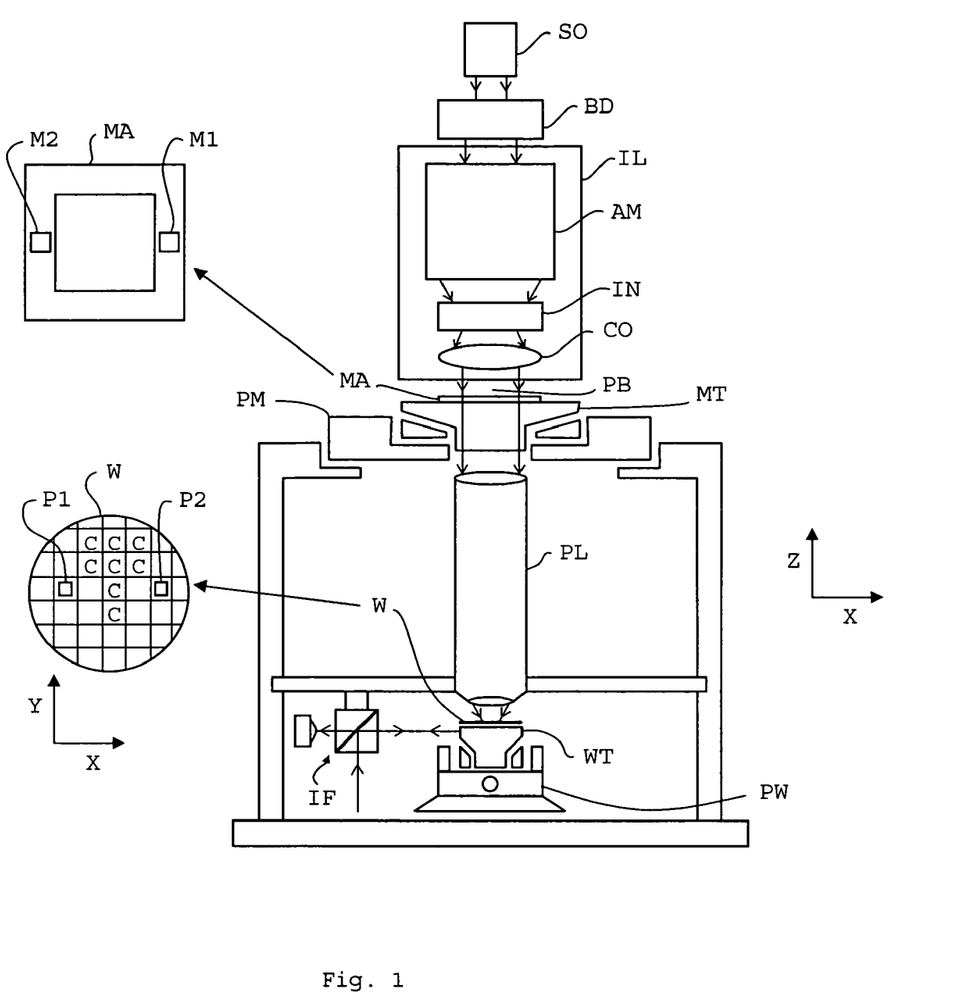
FIG. 1 depicts a lithographic apparatus according to an embodiment of the invention.

FIG. 1 schematically depicts a lithographic apparatus according to a particular embodiment of the invention. The apparatus comprises:

- an illumination system (illuminator) IL: for providing a projection beam PB of radiation (e.g. UV or EUV radiation).
- a first support structure (e.g. a mask table/holder) MT: for supporting patterning device (e.g. a mask) MA and connected to first positioning mechanism PM for accurately positioning the patterning device with respect to item PL;
- a substrate table (e.g. a wafer table/holder) WT: for holding a substrate (e.g. a resist-coated wafer) W and connected to second positioning mechanism PW for accurately positioning the substrate with respect to item PL; and
- a projection system (e.g. a reflective projection lens) PL: for imaging a pattern imparted to the projection beam PB by patterning device MA onto a target portion C (e.g. comprising one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may comprise adjusting mechanism for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning mechanism PW and position sensor IF2 (e.g. an interferometric device), the substrate table WT can be moved accurately, e.g. so as to position different target portions C in the path of the beam PB. Similarly, the first positioning mechanism PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module and a short-stroke module, which form part of the positioning mechanism PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

- step mode: the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.
- scan mode: the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
- other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Embodiments

Figure 2A:
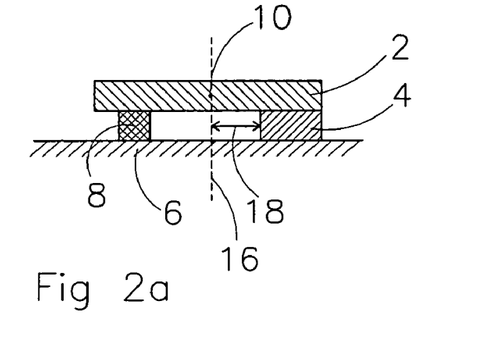
FIGS. 2a and 2b schematically show a side and a top view, respectively, of a prior art object carrier.
Figure 2B:
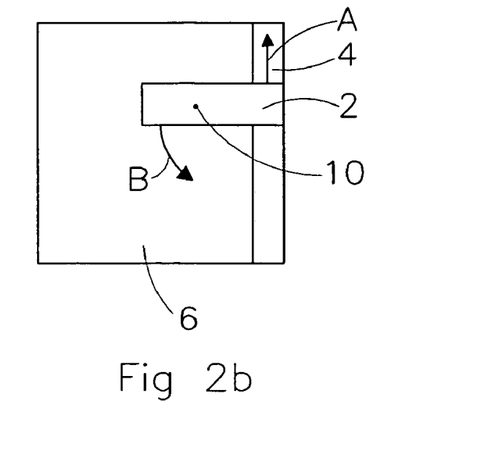

FIGS. 2a and 2b show a prior art embodiment of a system comprising a moveable object carrier 2 and a linear actuator 4 to move the object carrier 2. The linear actuator 4 is positioned on a stone 6. A center of gravity 10 of the object carrier 2 is horizontally spaced apart from the linear actuator 4, since a gravity line of action 16 vertically extending from the center of gravity 10 is horizontally spaced apart from the linear actuator 4 as indicated by an arrow 18. A bearing 8 supports the object carrier 2 at a side of the object carrier 2 opposite to the linear actuator 4 with respect to the center of gravity 10. The bearing 8 prevents the object carrier 2 from tilting or falling onto the stone 6 due to gravity.

The bearing 8 may be any suitable bearing for supporting the object carrier 2. Often, an air bearing is used, since such a bearing results in little friction. To support the bearing, the stone 6 is required. The stone 6, however, may also be any other kind of structure, material or frame suitable to support the bearing 8.

As illustrated, in this embodiment the object carrier 2 extends perpendicular from the linear actuator 4. When the linear actuator 4 accelerates the object carrier 2, for example in a direction indicated by an arrow A, the object carrier 2 is subject to a force which tends to tilt the object carrier 2 due to inertia as indicated by an arrow B, since the center of gravity 10 is horizontally spaced apart from the linear actuator 4.

Figure 3A:
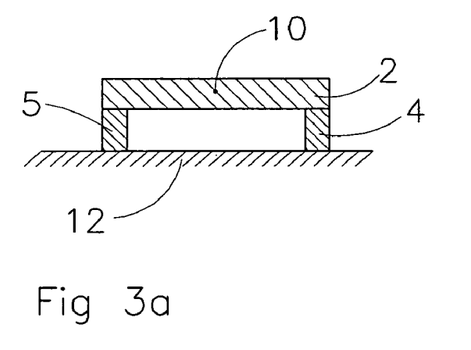
FIGS. 3a and 3b schematically show a cross-sectional side view and a top view, respectively, of a system for carrying and moving an object in a first direction.

FIG. 3a shows an embodiment of a system comprising object carrier 2 and two linear actuators 4 and 5. The system may move the object carrier 2 in a first direction. The linear actuators 4 and 5 are positioned on opposite sides of the object carrier 2 with respect to the center of gravity 10 of said carrier 2. In the illustrated embodiment, the linear actuators 4, 5 are positioned symmetrically with respect to the center of gravity 10 and at the ends of the object carrier 2. A frame or any other structure 12 may support the linear actuators 4, 5. The structure 12 may be a stone or may be any other structure suited to support the linear actuators 4, 5 and the object carrier 2.

Further, the linear actuators 4, 5 may be positioned under the object carrier 2, as illustrated, but they may also be positioned beside or above the object carrier 2. If the linear actuators 4, 5 are positioned above the object carrier 2, for example, the object carrier 2 may 'hang' on the linear actuators 4, 5.

Since the linear actuators 4 and 5 support the object carrier 2 on both sides of the center of gravity 10, the object carrier 2 cannot tilt or fall due to gravity, and therefore the bearing 8 is omitted with respect to the prior art embodiment of FIGS. 2a and 2b. Without the additional bearing 8, there is no need for a supporting stone 6, which is therefore changed to any supporting structure 12. Further, although the structure 12 is shown in FIG. 3a as being present underneath the complete system, the structure 12 only needs to support the linear actuators 4, 5. Therefore, the structure 12 may also comprise two separate supports each configured to support one of said actuators 4, 5.

Figure 3B:
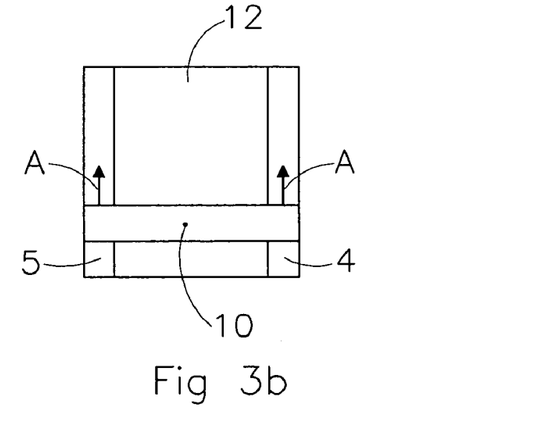

Referring to FIG. 3b, when the linear actuators 4, 5 accelerate the object carrier 2 as indicated by arrows A, the object carrier 2 may accelerate with the same amount on both sides and will thus not tend to rotate.

Figure 4A:
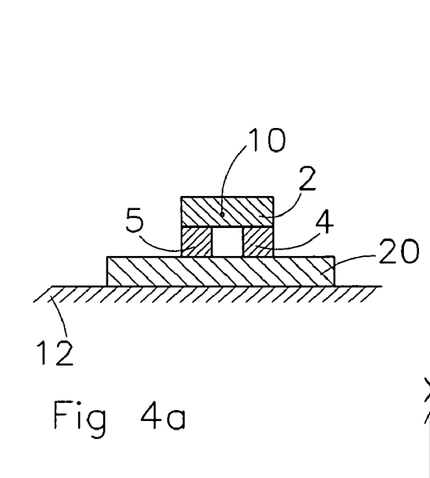
FIGS. 4a and 4b schematically show a cross-sectional side and a top view, respectively, of a system according to the present invention capable of positioning the object carrier in a plane.
Figure 4B:
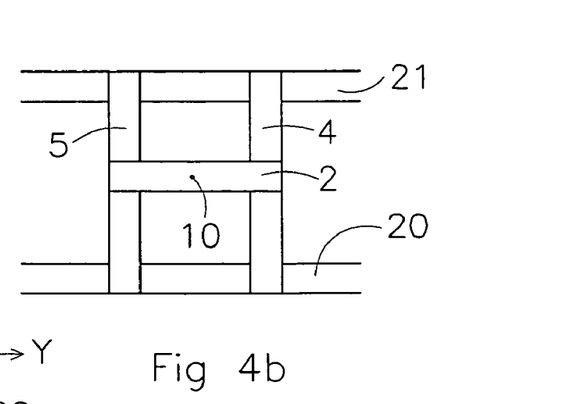

FIGS. 4a and 4b illustrate an embodiment according to the present invention, wherein the first and second linear actuator 4, 5 are positioned on and supported by a third and a fourth linear actuator 20, 21. The first and second actuator 4, 5 may move the object carrier 2 in an x-direction as indicated by a coordinate system 22. The third and fourth linear actuators 20, 21 may move the object carrier 2 in a y-direction perpendicular to the x-direction. Thus, the object carrier 2 may be positioned in a plane.

Figure 5A:
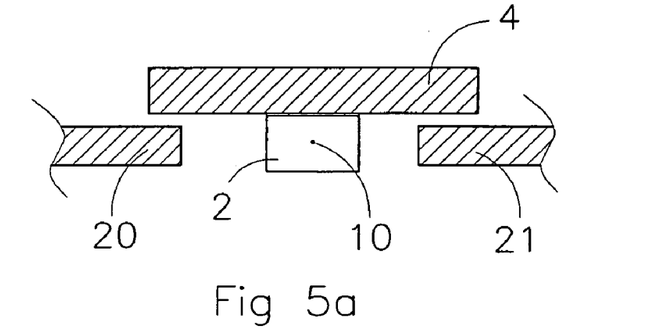
FIGS. 5a and 5b schematically show a cross-sectional side and a top view, respectively, of another embodiment of a system according to the present invention capable of positioning the object carrier in a plane.
Figure 5B:
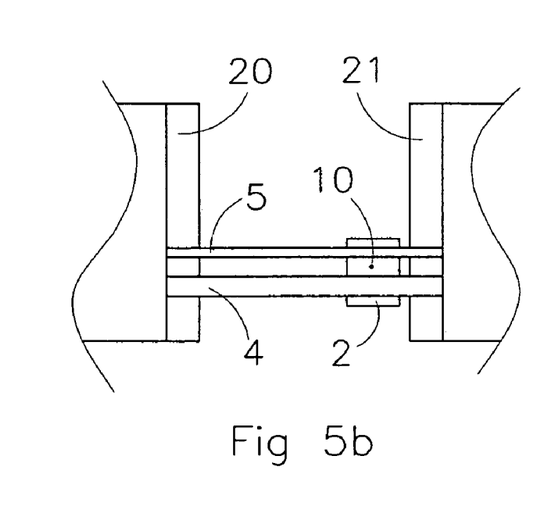

FIGS. 5a and 5b illustrate an embodiment of a system according to the present invention, wherein the object carrier 2 is supported by linear actuators 4, 5 while the linear actuators 4, 5 are positioned above the object carrier 2. The first set of linear actuators 4, 5 are for moving the object carrier 2 in a first direction. The linear actuators 4, 5 are supported by a second set of linear actuators 20, 21 for moving the object carrier 2 in a second direction. The embodiment shown in FIGS. 5a and 5b functions similar to the embodiment shown in FIGS. 4a and 4b.

It is an advantage of the embodiment shown in FIGS. 5a and 5b that the center of gravity 10 lies between the linear actuators 20, 21. In this embodiment the center of gravity 10 lies close to the plane wherein the forces, which are exerted by the linear actuators 20, 21 and 4, 5 on the object carrier 2, act upon the object carrier 2. This prevents a large moment acting on the object carrier 2, and thus horizontally and vertically tilting of the object carrier 2.

It is noted that the linear actuators 20, 21 are not positioned on a supporting structure 12 positioned beneath the object carrier 2 such as shown in FIGS. 3a and 4a. Thus, the space beneath the object carrier 2 may be free or be occupied with hardware not being used for supporting the object carrier 2, since there is no structure beneath the object carrier 2 needed for supporting the object carrier 2 according to the present invention.

Further, when an object is positioned on the object carrier 2, the center of gravity 10 of the object carrier 2 and the object together is shifted towards the object compared to the position of the center of gravity 10 shown in FIGS. 1-5. Therefore, it is advantageous not to position the object carrier 2 having an object positioned thereon over any linear actuator 4, 5, 20, 21, thereby possibly positioning the joined center of gravity of the object and the object carrier 2 such that the linear actuators are not on horizontally opposite sides of said center of gravity anymore. In the embodiment of FIGS. 5a and 5b the object carrier 2 cannot move over the linear actuators 20, 21 since it is positioned between said linear actuators 20, 21. Also, in the embodiments shown in FIGS. 3 and 4, there may be means present to prevent the object carrier 2 moving over any of the linear actuators 4, 5, 20, 21.

Figure 6:
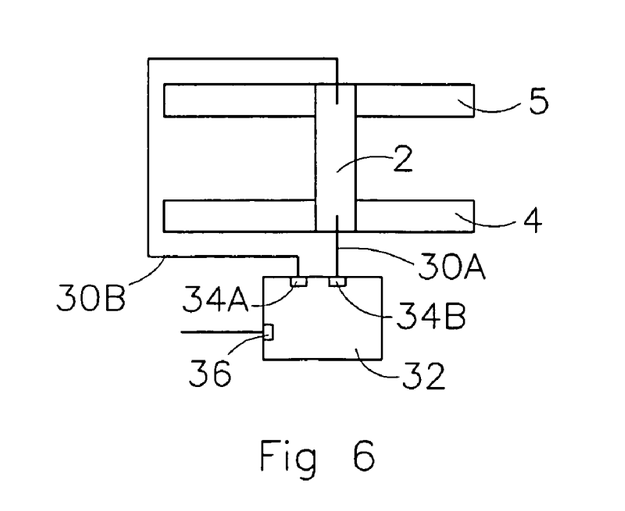
FIG. 6 schematically illustrates an embodiment according to the present invention having a control system.

FIG. 6 illustrates an embodiment like the embodiment shown in FIGS. 3a and 3b including a control system 32. The control system 32 may be any position control system known to a person skilled in the art. Further, each linear actuator 4, 5 has a signal lead 30a, 30b, respectively, with said control system 32 connected at control terminals 34a, 34b, respectively. At a set input terminal 36 a position signal may instruct the control system 32 to which position the object carrier 2 should be moved. Instead of a position signal, in specific embodiments, a desired acceleration or speed of the object carrier 2 may be set at the set input terminal 36.

Using a simple control method, the control system 32 outputs a control signal through the signal leads 30a, 30b to the linear actuators 4, 5 resulting in a movement of the object carrier 2. The control system 32 determines the control signal from a position it calculated earlier, but since no feedback is given to the control system 32 said calculated position does not need to be the correct actual position. In a more advanced control method, the signal leads 30a, 30b are bi-directional.

The control system 32 may output said control signal through the signal leads 30a, 30b and a position measurement system, for example included in the linear actuators 4, 5 or stand-alone, may output an actual position of the object carrier 2, or it may output separate actual positions for each of the linear actuators 4, 5. In the latter case, the control system 32 may calculate a rotation of the object carrier 2 from the separate actual linear actuator positions, and may compensate any non-desired rotation by outputting different control signals to the linear actuators 4, 5. Advantageously, for compensating any positional and rotational errors, the control system 32 may be calibrated before use.

Note that the signal leads 30a, 30b are running to the part of the linear actuators 4, 5 at or near the object carrier 2 possibly suggesting that a moving part, being part of the linear actuator and being controlled by the control system 32, is present at or near the object carrier 2. However, this is not an essential feature of the present invention. The linear actuators as employed in the present invention, may comprise a stator and a moving part, or may comprise two moving parts, or any other number of static and moving parts. Further, the moving parts may be positioned at the object carrier 2 and/or at the supporting structure 12. Thus, no moving parts need to be present on the object carrier 2.

Figure 7:
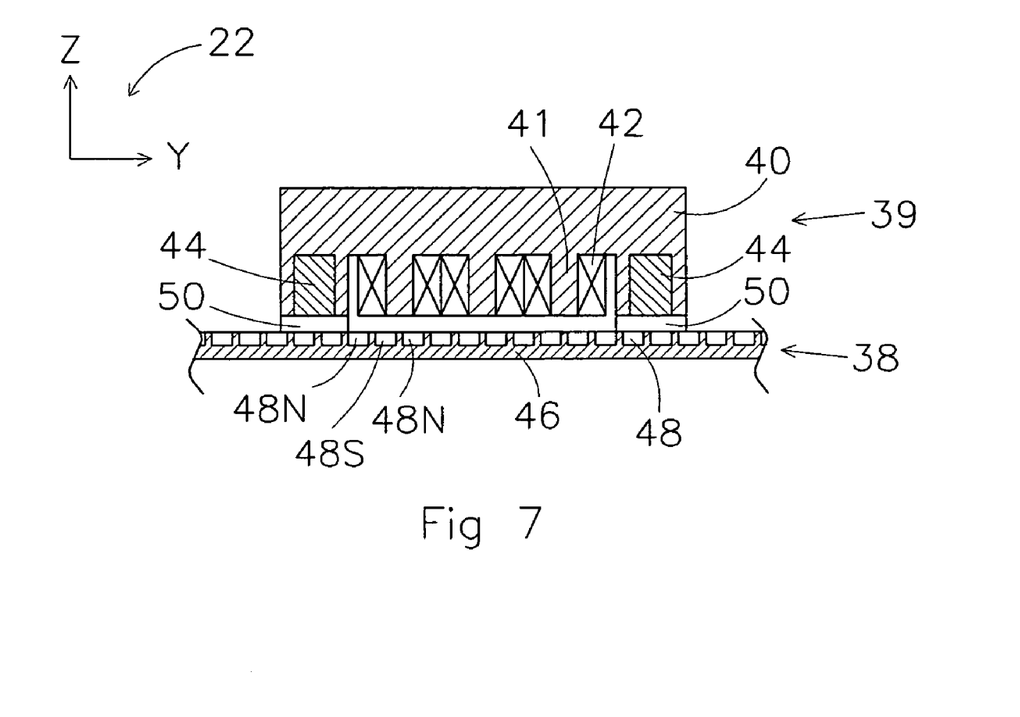
FIG. 7 schematically shows a linear actuator adapted for supporting an object carrier.

FIG. 7 illustrates an embodiment of a linear actuator suitable for use in a system according to the present invention. The linear actuator is adapted for supporting an object carrier and/or an object that is to be moved by the linear actuator. The linear actuator comprises a magnetic structure 38 and a coil structure 39. The magnetic structure 38 comprises a base plate 46 and a number of magnets 48. The magnets 48 are positioned in a row and the magnets 48 have alternating poles (north and south poles) at an outer surface of the magnetic structure 38 as indicated in FIG. 7 by magnets 48N (north pole) and 48S (south pole).

The coil structure 39 is positioned at a distance from the magnetic structure 38 and comprises an iron core 40. The iron core 40 has a number of teeth 41. Around a number of said teeth 41 a coil 42 is wound. To insulate the iron core from the coil, the coil may be wound around a coil former, made of electrically insulated material.

Alternatively, the iron core may be coated with an insulation layer to ensuring an insulation between the iron core and the coil. Since an attractive force is present between the magnetic structure 38 and the coil structure 39 the linear actuator is provided with means to keep the structures 38, 39 spaced apart. These means may be any kind of device or system keeping the two structures 38, 39 apart, but preferably the means is an air bearing providing a minimum of friction. In FIG. 7 the coil structure 39 is provided with air bearings 44 at both ends of the structure 39. The air bearings 44 provide an air cushion 50 between the coil structure 39 and the magnetic structure 38. It is readily understood that the air bearings 44 may equivalently be provided in the magnetic structure 38.

The linear actuator illustrated in FIG. 7 functions as follows. In the description below it is assumed that an object to be moved is connected to the coil structure 39, so the magnetic structure 38 acts as a stator, while the coil structure 39 acts as a moving part. However, equivalently, the coil structure 39 may act as a stator. Further, both structures may be moving parts, in which case the structure not connected with the object may act as a balance mass in order to keep any arising reaction forces within the system. For a detailed description of a balanced positioning system, there is referred to U.S. Pat. No. 6,449,030, for example.

To move the object in a first direction, the row of magnets 48 of the magnetic structure 38 is orientated in said first direction. The teeth 41 of the iron core 40 of the coil structure 39 are also orientated in a row in said first direction opposite to the magnets 48. The air bearings 44 keep the structures 38, 39 at a predetermined distance from each other. Feeding a controlled current through each coil 42 will result in a movement in a y-direction as indicated by a coordinate system 22. A control method and system requirements for moving the two structures 38, 39 relative to each other are known in the art and will not be explained in further detail here.

To support the object to be moved, the air bearings 44 are suitable for keeping the two structures 38, 39 apart independent of any additional load on one or both structures 38, 39. This requires possibly a more powerful air bearing and possibly a control system to keep the predetermined distance between the two structures. For example, the actual distance between the two structures 38, 39 is determined and in response to said actual distance the output of the air bearings 44 is adjusted in order to make the actual distance equal to the predetermined distance.

Figure 8:
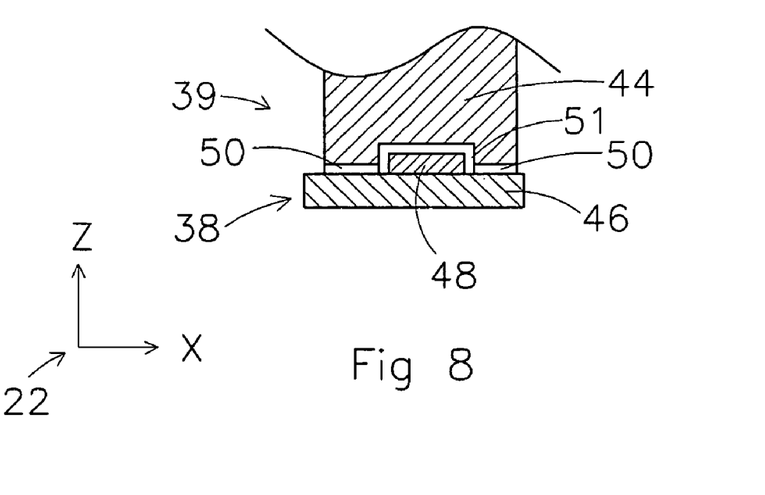
FIG. 8 schematically illustrates an embodiment of an air bearing in a linear actuator.

FIG. 8 shows a cross-sectional view of another embodiment of a linear actuator suitable for application in a system according to the present invention. In the embodiment the magnets 48 of the magnetic structure 38 are positioned on top of the base plate 46. The air bearing 44 has ends positioned around the magnets 48. Thus, the air bearing 44 may form two air cushions 50. Further, an additional air cushion 51 may be generated in order to position the magnetic structure 38 and the coil structure 39 relative to each other not only in a z-direction (as indicated by a coordinate system 22), but also in a x-direction, both directions being perpendicular to a direction of movement (y-direction).

Whilst specific embodiments of the invention have been described above, it will be appreciated that the invention may be practiced otherwise than as described. As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A system for carrying and moving an object in a plane, comprising:
   an object carrier;
   a first and a second linear actuator configured to support said object carrier and move said object carrier in a first direction, said first and second linear actuators extending in parallel along said first direction, said first and second linear actuators being electromagnetic linear actuators comprising:
   a magnetic structure, and
   a coil structure,
   wherein the coil structure and the magnetic structure are positioned relative to each other and separated by an air bearing attached to the coil structure or the magnetic structure and configured to support said object carrier during motion at a first position along said first direction, the first position being on one end of whichever of the magnetic structure or coil structure is connected to the object carrier, and at a second position displaced from the first position along said first direction, the second position being on the opposite end of whichever of the magnetic structure or coil structure is connected to the object carrier, wherein the first and second positions and whichever of the magnetic structure or coil structure is connected to the object carrier are substantially in a same plane; and
   a third and a fourth linear actuator configured to move said object carrier in a second direction, said third and fourth linear actuators extending in parallel along said second direction,
   wherein both the coil structure and the magnetic structure of the first and second linear actuators are moveable with respect to each other or both a coil structure and a magnetic structure of the third and fourth linear actuators are moveable with respect to each other, the coil structure or the magnetic structure of the respective pair of coil structure and magnetic structure of the respective linear actuator configured as a balance mass to receive reaction forces arising from the movement of the other of the coil structure or the magnetic structure.

2. The system of claim 1, wherein said third and fourth linear actuators are adapted to support said first and second linear actuators.

3. The system of claim 2, wherein said third and fourth linear actuators each comprise an air bearing to support said first and second linear actuators.

4. The system of claim 2, wherein said third and fourth linear actuators are electromagnetic linear actuators, comprising:
a magnetic structure having a row of alternating magnetic poles on an outer surface thereof, said row being orientated in said first direction; and
a coil structure having an iron core with a number of teeth in a row orientated in said first direction and having a number of coils wound around a respective number of said teeth;
wherein the coil structure and the magnetic structure are positioned relative to each other such that the row of magnetic poles is positioned opposing the row of teeth around which coils are wound, the coil structure and the magnetic structure being separated by an air bearing.

5. The system of claim 4, wherein said air bearing for separating the coil structure and the magnetic structure is adapted to support said first and second linear actuators.

6. The system of claim 2, wherein said first and second linear actuators are positioned relative to said third and fourth linear actuators such that a common center of gravity of said first and second linear actuators is positioned between said third and fourth linear actuators.

7. The system of claim 2, wherein said third and fourth linear actuators are substantially symmetrically positioned with respect to the common center of gravity of the first and second linear actuators.

8. The system of claim 2, wherein said third and fourth linear actuators are positioned at opposite ends of said first and second linear actuators.

9. The system of claim 1, wherein said magnetic structure includes a row of alternating magnetic poles on an outer surface thereof, said row being orientated in said first direction; and
said coil structure includes an iron core with a number of teeth in a row orientated in said first direction and having a number of coils wound around a respective number of said teeth;
wherein the relative positioning of the coil structure and the magnetic structure is configured so that the row of magnetic poles is positioned opposing the row of teeth, around which coils are wound.

10. The system of claim 1, wherein said object carrier is positioned relative to said first and second linear actuators such that a vertical line through a center of gravity of said object carrier is located between said first and second linear actuators.

11. The system of claim 1, wherein said first and second linear actuators are substantially symmetrically positioned with respect to the center of gravity of said object carrier.

12. The system of claim 1, wherein said first and second linear actuators are positioned at opposite ends of the object carrier.

13. The system of claim 1, wherein said second direction is perpendicular to said first direction.

14. The system of claim 1, further comprising a control system configured to control said first and second linear actuators.

15. A lithographic apparatus, comprising:
an illumination system configured to provide a beam of radiation;
a carrier structure configured to carry a patterning device, the patterning device serving to impart the beam of radiation with a pattern in its cross-section;
a first and second linear actuator configured to support said carrier structure and move said carrier structure in a first direction, said first and second linear actuators extending in parallel along said first direction, said first and second linear actuators being electromagnetic linear actuators comprising:
a magnetic structure, and
a coil structure,
wherein the coil structure and the magnetic structure are positioned relative to each other and separated by an air bearing attached to the coil structure or the magnetic structure and configured to support said carrier structure during motion at a first position along said first direction, the first position being on one end of whichever of the magnetic structure or coil structure is connected to the carrier structure, and at a second position displaced from the first position along said first direction, the second position being on the opposite end of whichever of the magnetic structure or coil structure is connected to the carrier structure, wherein the first and second positions and whichever of the magnetic structure or coil structure is connected to the carrier structure are substantially in a same plane;
a third and a fourth linear actuator configured to move said carrier structure in a second direction, said third and fourth linear actuators extending in parallel along said second direction;
a substrate holder configured to hold a substrate; and
a projection system configured to project the patterned beam onto a target portion of the substrate,
wherein both the coil structure and the magnetic structure of the first and second linear actuators are moveable with respect to each other or both a coil structure and a magnetic structure of the third and fourth linear actuators are moveable with respect to each other, the coil structure or the magnetic structure of the respective pair of coil structure and magnetic structure of the respective linear actuator configured as a balance mass to receive reaction forces arising from the movement of the other of the coil structure or the magnetic structure.

16. A lithographic apparatus, comprising:
an illumination system configured to provide a beam of radiation;
a support structure configured to support a patterning device, the patterning device serving to impart the beam of radiation with a pattern in its cross-section;
a carrier structure configured to carry a substrate;
a first and second linear actuator configured to support said carrier structure and move said carrier structure in a first direction, said first and second linear actuators extending in parallel along said first direction, said first and second linear actuators being electromagnetic linear actuators comprising:
a magnetic structure, and
a coil structure,
wherein the coil structure and the magnetic structure are positioned relative to each other and separated by an air bearing attached to the coil structure or the magnetic structure and configured to support said carrier structure during motion at a first position along said first direction, the first position being on one end of whichever of the magnetic structure or coil structure is connected to the carrier structure, and at a second position displaced from the first position along said first direction, the second position being on the opposite end of whichever of the magnetic structure or coil structure is connected to the carrier structure, wherein the first and second positions and whichever of the magnetic structure or coil structure is connected to the carrier structure are substantially in a same plane;

a third and a fourth linear actuator configured to move said carrier structure in a second direction, said third and fourth linear actuators extending in parallel along said second direction; and a projection system configured to project the patterned beam onto a target portion of the substrate, wherein both the coil structure and the magnetic structure of the first and second linear actuators are moveable with respect to each other or both a coil structure and a magnetic structure of the third and fourth linear actuators are moveable with respect to each other, the coil structure or the magnetic structure of the respective pair of coil structure and magnetic structure of the respective linear actuator configured as a balance mass to receive reaction forces arising from the movement of the other of the coil structure or the magnetic structure.

17. A method for carrying and moving an object in a plane, comprising:

positioning said object on an object carrier, said object carrier being moveable by a first and a second linear actuator in a first direction and by a third and a fourth linear actuator in a second direction, said first and second linear actuators being adapted to support said object carrier by having a coil structure and a magnetic structure that are separated by an air bearing attached to the coil structure or the magnetic structure and configured to support said object carrier during motion at a first position along said first direction, the first position being on one end of whichever of the magnetic structure or coil structure is connected to the object carrier, and at a second position displaced from the first position along said first direction, the second position being on the opposite end of whichever of the magnetic structure or coil structure is connected to the object carrier, wherein the first and second positions and whichever of the magnetic structure or coil structure is connected to the object carrier are substantially in a same plane, and wherein both the coil structure and the magnetic structure of the first and second linear actuators are moveable with respect to each other or both a coil structure and a magnetic structure of the third and fourth linear actuators are moveable with respect to each other, the coil structure or the magnetic structure of the respective pair of coil structure and magnetic structure of the respective linear actuator configured as a balance mass to receive reaction forces arising from the movement of the other of the coil structure or the magnetic structure; and controlling said first and second linear actuators to move said object carrier in said first direction.

18. The method of claim 17, further comprising controlling said third and fourth linear actuators to move said object carrier in said second direction.

19. The method of claim 17, wherein said third and fourth linear actuators support said first and second linear actuators.

20. The method of claim 19, wherein said third and fourth linear actuators each comprise an air bearing supporting said first and second linear actuators.

21. The method of claim 19, wherein said first and second linear actuators are positioned relative to said third and fourth linear actuators such that a common center of gravity of said first and second linear actuators is positioned between said third and fourth linear actuators.

22. The method of claim 17, wherein said magnetic structure includes a row of alternating magnetic poles on an outer surface thereof, said row being orientated in said first direction; and said coil structure includes an iron core with a number of teeth in a row orientated in said first direction and having a number of coils wound around a respective number of said teeth;

wherein the relative positioning of the coil structure and the magnetic structure is configured so that the row of magnetic poles is positioned opposing the row of teeth, around which coils are wound.

23. The method of claim 17, wherein said object carrier is positioned relative to said first and second linear actuators such that a vertical line through a center of gravity of said object carrier is located between said first and second linear actuators.

24. A device manufacturing method, comprising:

providing a substrate;

providing a beam of radiation using an illumination system;

imparting the beam of radiation with a desired pattern in its cross-section based on a patterning device;

positioning said patterning device on an object carrier, said object carrier being moveable by a first and a second linear actuator in a first direction and by a third and a fourth linear actuator in a second direction, said first and second linear actuators being adapted to support said object carrier by having a coil structure and a magnetic structure that are separated by an air bearing attached to the coil structure or the magnetic structure and configured to support said object carrier during motion at a first position along said first direction, the first position being on one end of whichever of the magnetic structure or coil structure is connected to the object carrier, and at a second position displaced from the first position along said first direction, the second position being on the opposite end of whichever of the magnetic structure or coil structure is connected to the object carrier, wherein the first and second positions and whichever of the magnetic structure or coil structure is connected to the object carrier are substantially in a same plane, and wherein both the coil structure and the magnetic structure of the first and second linear actuators are moveable with respect to each other or both a coil structure and a magnetic structure of the third and fourth linear actuators are moveable with respect to each other, the coil structure or the magnetic structure of the respective pair of coil structure and magnetic structure of the respective linear actuator configured as a balance mass to receive reaction forces arising from the movement of the other of the coil structure or the magnetic structure;

controlling said first and second linear actuators to move said object carrier in said first direction; and projecting the patterned beam of radiation onto a target portion of the substrate.

25. A device manufacturing method, comprising:

providing a substrate;

providing a beam of radiation using an illumination system;

imparting the beam of radiation with a desired pattern in its cross-section based on a patterning device;

positioning said substrate on an object carrier, said object carrier being moveable by a first and a second linear actuator in a first direction and by a third and a fourth linear actuator in a second direction, said first and second linear actuators being adapted to support said object carrier by having a coil structure and a magnetic structure that are separated by an air bearing attached to the coil structure or the magnetic structure and configured to support said object carrier during motion at a first position along said first direction, the first position being on one end of whichever of the magnetic structure or coil structure is connected to the object carrier, and at a second position displaced from the first position along said first direction, the second position being on the opposite end of whichever of the magnetic structure or coil structure is connected to the object carrier, wherein the first and second positions and whichever of the magnetic structure or coil structure is connected to the object carrier are substantially in a same plane, and wherein both the coil structure and the magnetic structure of the first and second linear actuators are moveable with respect to each other or both a coil structure and a magnetic structure of the third and fourth linear actuators are moveable with respect to each other, the coil structure or the magnetic structure of the respective pair of coil structure and magnetic structure of the respective linear actuator configured as a balance mass to receive reaction forces arising from the movement of the other of the coil structure or the magnetic structure;

controlling said first and second linear actuators to move said object carrier in said first direction; and projecting the patterned beam of radiation onto a target portion of the substrate.

* * * * *